US012244137B2

(12) United States Patent
Russ et al.

(10) Patent No.: US 12,244,137 B2
(45) Date of Patent: Mar. 4, 2025

(54) ESD PROTECTION FOR MULTI-DIE INTEGRATED CIRCUITS (ICS) INCLUDING INTEGRATED PASSIVE DEVICES

(71) Applicant: Infineon Technologies AG, Neubiberg (DE)

(72) Inventors: Christian Cornelius Russ, Diedorf (DE); Kai Esmark, Neuried (DE)

(73) Assignee: Infineon Technologies AG, Neubiberg (DE)

( * ) Notice: Subject to any disclaimer, the term of this patent is extended or adjusted under 35 U.S.C. 154(b) by 389 days.

(21) Appl. No.: 17/743,637

(22) Filed: May 13, 2022

(65) Prior Publication Data

US 2023/0369849 A1 Nov. 16, 2023

(51) Int. Cl.
*H02H 9/04* (2006.01)
*H01L 25/065* (2023.01)
(Continued)

(52) U.S. Cl.
CPC ........ *H02H 9/046* (2013.01); *H01L 25/0655* (2013.01); *H01L 27/0255* (2013.01); *H01L 27/0266* (2013.01); *H01L 27/0288* (2013.01); *H01L 27/0292* (2013.01); *H01L 23/538* (2013.01); *H01L 24/48* (2013.01); *H01L 24/49* (2013.01); *H01L 25/18* (2013.01); *H01L 27/0296* (2013.01);
(Continued)

(58) Field of Classification Search
CPC ....... H02H 9/046; H01L 23/60; H01L 23/538; H01L 24/49; H01L 24/48; H01L 25/0655; H01L 25/18; H01L 2/0255; H01L 2/0292; H01L 2/0288; H01L 2/0266; H01L 2/0296; H01L 2224/49175; H01L 2224/48175; H01L 2224/48137
USPC .......................................................... 361/56
See application file for complete search history.

(56) References Cited

U.S. PATENT DOCUMENTS 10,128,229 B1 * 11/2018 Davis .................. H01L 27/0288
11,398,469 B1 * 7/2022 Karp .................... H01L 25/0657
(Continued)

FOREIGN PATENT DOCUMENTS

CN 113990860 A * 1/2022

OTHER PUBLICATIONS

Machine translation of Gao et al. Chinese Patent Document CN 113990860 A Jan. 2022 (Year: 2022).*

(Continued)

*Primary Examiner* — Kevin J Comber
(74) *Attorney, Agent, or Firm* — Banner & Witcoff Ltd.

(57) ABSTRACT

The described techniques address issues associated with electrostatic discharge (ESD) protection for multi-die integrated circuits (ICs). The techniques include the use of two or more semiconductor dies within a multi-die IC, which may include a first semiconductor die without ESD protection but with full ESD exposure. The first semiconductor receives ESD protection via a second semiconductor die that is integrated as part of the same package with the first semiconductor die. The second semiconductor die may be electrically more remote from ESD-exposed pins compared to the first semiconductor die. The first semiconductor die may include integrated passive devices. The second semiconductor die enables ESD protection for both semiconductor dies in the same integrated IC package.

20 Claims, 11 Drawing Sheets

(51) Int. Cl.
*H01L 27/02* (2006.01)
*H01L 23/00* (2006.01)
*H01L 23/538* (2006.01)
*H01L 25/18* (2023.01)

(52) U.S. Cl.
CPC ............... *H01L 2224/48137* (2013.01); *H01L 2224/48175* (2013.01); *H01L 2224/49175* (2013.01)

(56) References Cited

U.S. PATENT DOCUMENTS

2011/0031598 A1* 2/2011 Lee ................... H01L 23/49833
257/E21.705
2017/0373490 A1* 12/2017 Zhu ........................ H02H 9/025

OTHER PUBLICATIONS

Strambini et al. "Three-dimensional silicon-integrated capacitor with unprecedented areal capacitance for on-chip energy storage" 2019 (Year: 2019).*
A. Amerasekera, et al., "ESD in Silicon Integrated Circuits, Second Edition", John Wiley & Sons, Ltd., 421 pages, 2002.

* cited by examiner

US 12,244,137 B2

ESD PROTECTION FOR MULTI-DIE INTEGRATED CIRCUITS (ICS) INCLUDING INTEGRATED PASSIVE DEVICES

TECHNICAL FIELD

The aspects described herein generally relate to electrostatic discharge (ESD) protection for multi-die integrated circuits (ICs) and, in particular to semiconductor dies having full ESD exposure that receive ESD protection via another semiconductor die in the same package.

BACKGROUND

Electrostatic discharge (ESD) is a sudden and momentary flow of electric current between two electrically charged objects caused by contact, an electrical short, or dielectric breakdown. Electronic devices such as integrated circuits are sensitive to ESD events, and therefore implement protective measures to ensure robustness to such events during ordinary use. Furthermore, it is common for many electronic components to undergo regulatory testing to ensure adequate ESD protection, i.e. that ESD events do not damage components or cause component failures. ICs may also implement other protective measures to guard against power supply fluctuations and electromagnetic compatibility (EMC) events. However, conventional implementations for ESD protection have various drawbacks.

BRIEF DESCRIPTION OF THE DRAWINGS/FIGURES

The accompanying drawings, which are incorporated herein and form a part of the specification, illustrate the aspects of the present disclosure and, together with the description, further serve to explain the principles of the aspects and to enable a person skilled in the pertinent art to make and use the aspects.

The example aspects of the present disclosure will be described with reference to the accompanying drawings. The drawing in which an element first appears is typically indicated by the leftmost digit(s) in the corresponding reference number.

SUMMARY

IC applications often require passive components such as capacitors near the IC pins for supply voltage buffering, e.g. in case of short supply fluctuations or short supply interruptions. Capacitors may also provide functions such as filtering of disturbances caused by EMC events. Conventional solutions to provide such protection include silicon dies with so-called Integrated Passive Devices (IPD), which typically comprise capacitors or optional resistors. These passive components are integrated in the same package with one more other silicon dies containing active circuitry such as digital, analog, memory, communication, sensors, and other blocks.

Figures 1A, 1B:
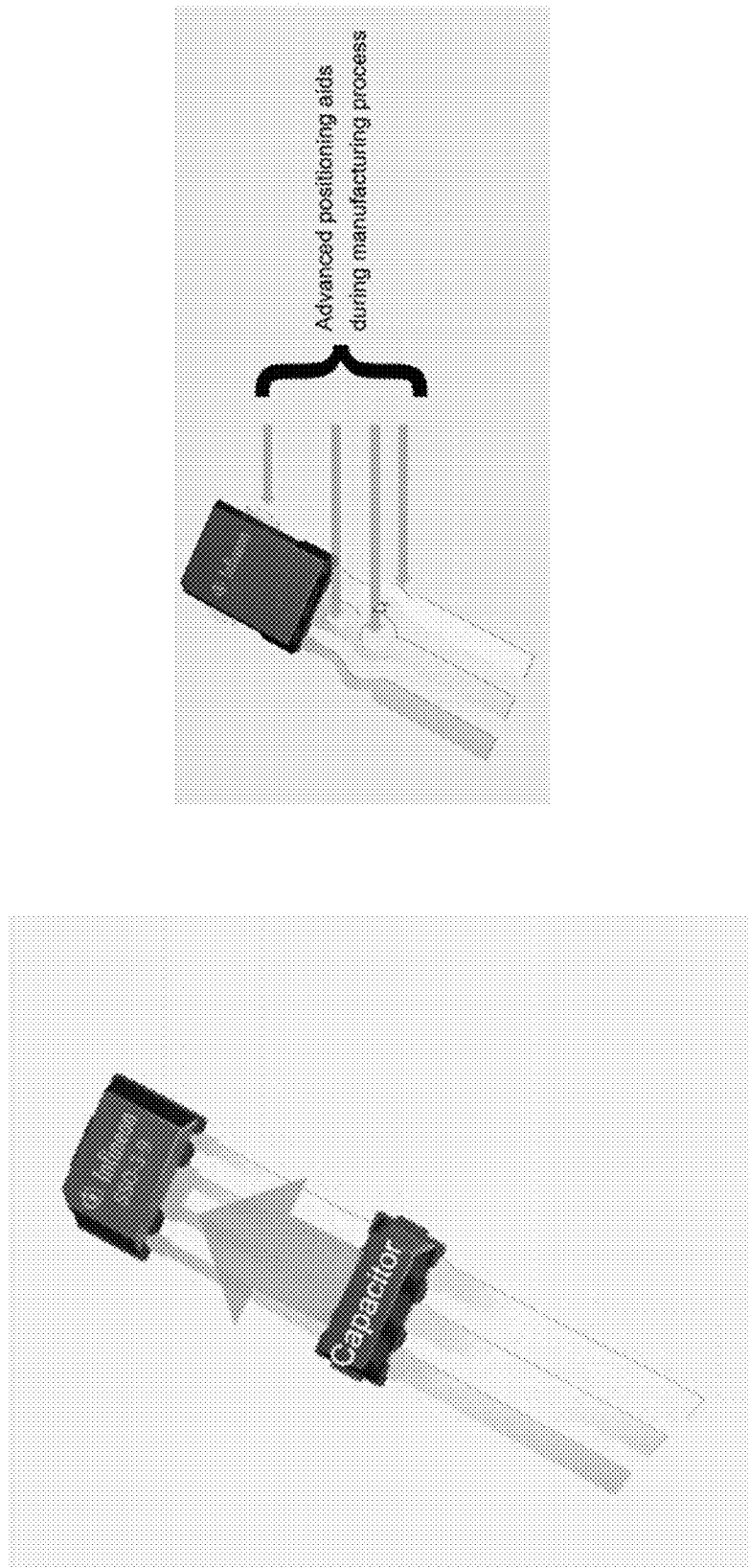
FIG. 1A illustrates a conventional IC package with overmolded capacitors.
FIG. 1B illustrates a silicon die and passive components integrated in the same package.

Traditionally, capacitors are either mounted as SMD components on the printed circuit board to which the IC is mounted, or affixed onto the IC package leads and overmolded, as shown in FIG. 1A. Other conventional solutions include both the silicon die and the passive components being integrated in the same package, as shown in FIG. 1B. Such solutions implement silicon capacitors, or "SilCaps," which are typically formed by trenches etched into the silicon substrate, as well as a dielectric to ensure high reliability and extremely low failure rates. The benefits of an integrated package as shown in FIG. 1B, which utilizes such SilCaps, include increased EMC robustness due to short connections to the active die(s), improved mechanical properties, and better reliability (avoidance of silver migration problem from the conductive glue damaging the conventional SMD capacitors connected the IC leads). Furthermore, integrated silicon capacitors feature superior electrical characteristics such as very low parasitic resistance and inductance, which makes them highly suitable for RF applications. Such integrated silicon capacitors also demonstrate excellent voltage-stability for capacitance value compared to discrete SMD components.

Figure 2:
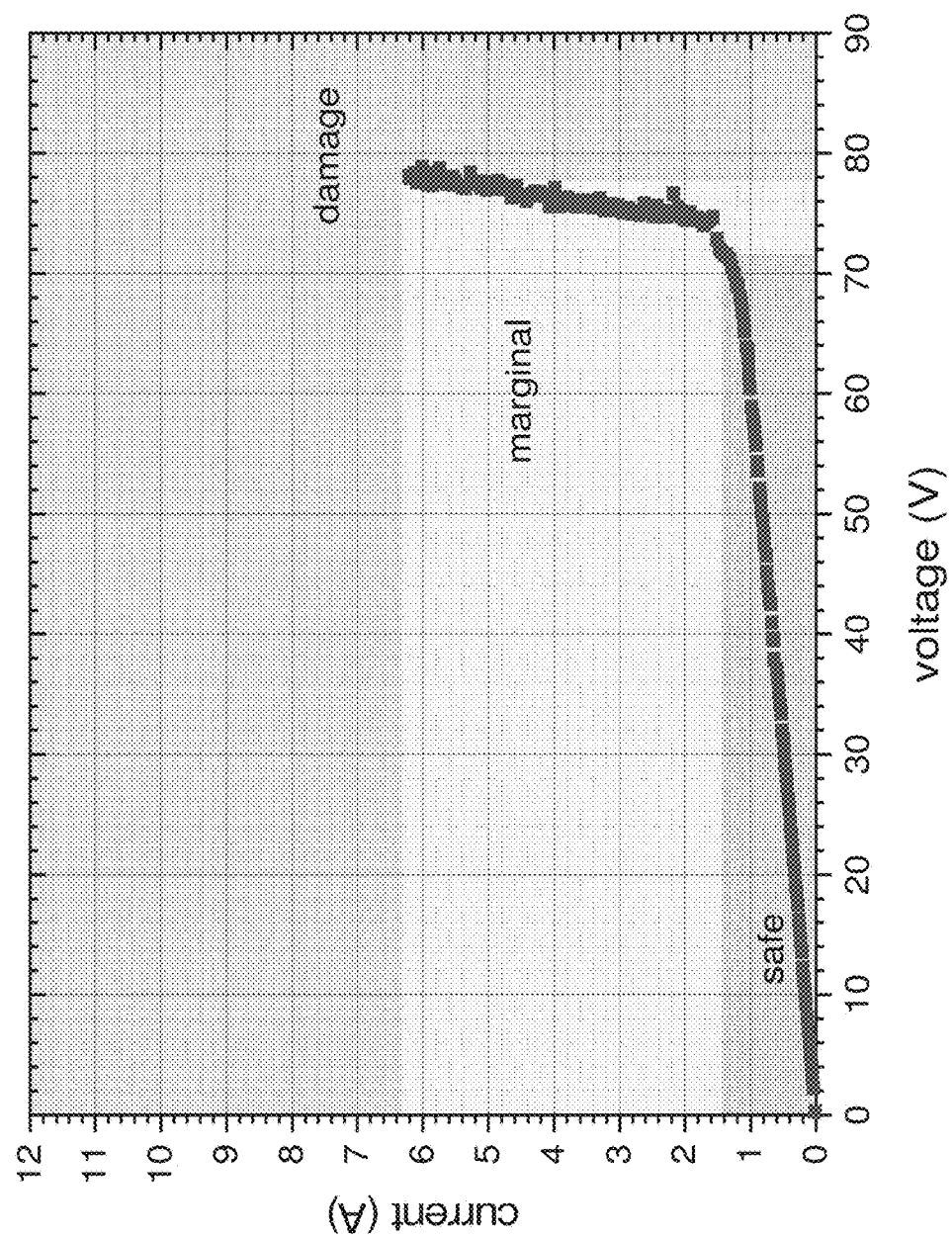
FIG. 2 illustrates intrinsic ESD robustness of an integrated silicon capacitor ("SilCap") on a current versus voltage graph.

However, the voltage robustness of integrated silicon capacitors—including for short ESD pulses during which the capacitor charges up—is limited, while conventionally used SMD-based capacitors are typically much more robust. For instance, and as shown in FIG. 2, if voltages of around and above 78V are reached, an integrated silicon capacitor will typically fail due to dielectric breakdown, and permanent damage in the form of a short between the terminals will result. In a marginal scenario between 72 and 78V, which should be avoided, the integrated silicon capacitor begins to conduct strongly because of charge tunneling in the dielectric layer.

However, despite the limitations, the implementation of silicon integrated capacitors is acceptable as a tradeoff with respect to lower costs, and thus it is often desirable to only implement integrated silicon capacitors as part of a silicon die package. But current solutions fail to provide adequate ESD protection in form of diodes or any other active ESD protection elements to limit the voltage or dissipate the energy of an ESD pulse. Therefore, in such scenarios, with the exception of a limited capability of capacitive damping of the ESD pulse, the integrated silicon capacitors are unprotected with respect to ESD events. This is of particular concern for integrated silicon capacitors that represent smaller capacitor values, which are prone to quick charging to a damaging level of high voltage.

Therefore, the embodiments as discussed in further detail herein aim to address these issues by providing a multi-die architecture that utilizes the ESD protection provided by a secondary die(s). The passive components in the primary semiconductor die may be in direct and in close contact with the external IC pins, and thus be fully exposed to the ESD stress from ESD events. The embodiments as further discussed herein extend the protection capabilities provided by the secondary die to the integrated passive components on the otherwise unprotected primary die.

DETAILED DESCRIPTION

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

Conventional Semiconductor ESD Protection

Figure 3B:
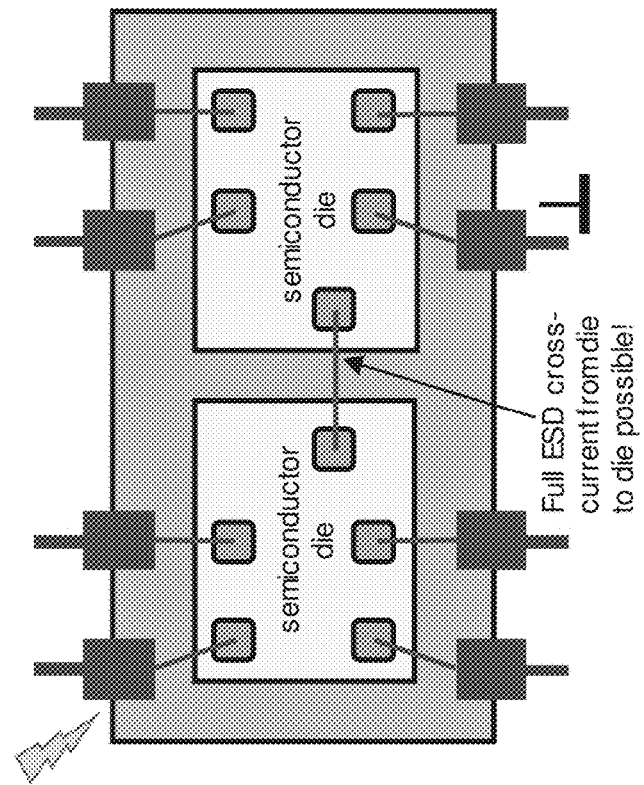
FIG. 3A-3D illustrate conventional solutions for ESD protection in single- and multi-die IC packages.
Figure 3A:
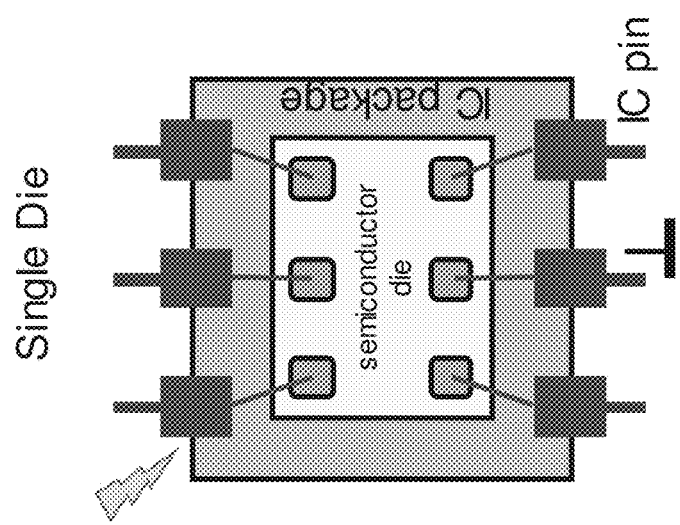

FIG. 3A-3D illustrate conventional solutions for ESD protection in single- and multi-die IC packages. Semiconductor dies require either on-die ESD protection or need to be placed remotely from the ESD stress, which originates at the external pins of the IC. Typically, and as shown in FIG. 3A, for single semiconductor die IC packages all pads on the die (i.e. each pad that is connected to an external pin) is required to have full ESD protection, which is typically implemented as active ESD protection circuitry. As shown in FIG. 3B, for multi-die IC packages this is also the case, i.e. all pads on each die that are coupled to external IC pins are also required to have full ESD protection. However, internal die-to-die connections must additionally have full ESD protection due to the possible ESD currents across this connection.

Figures 3C, 3D:
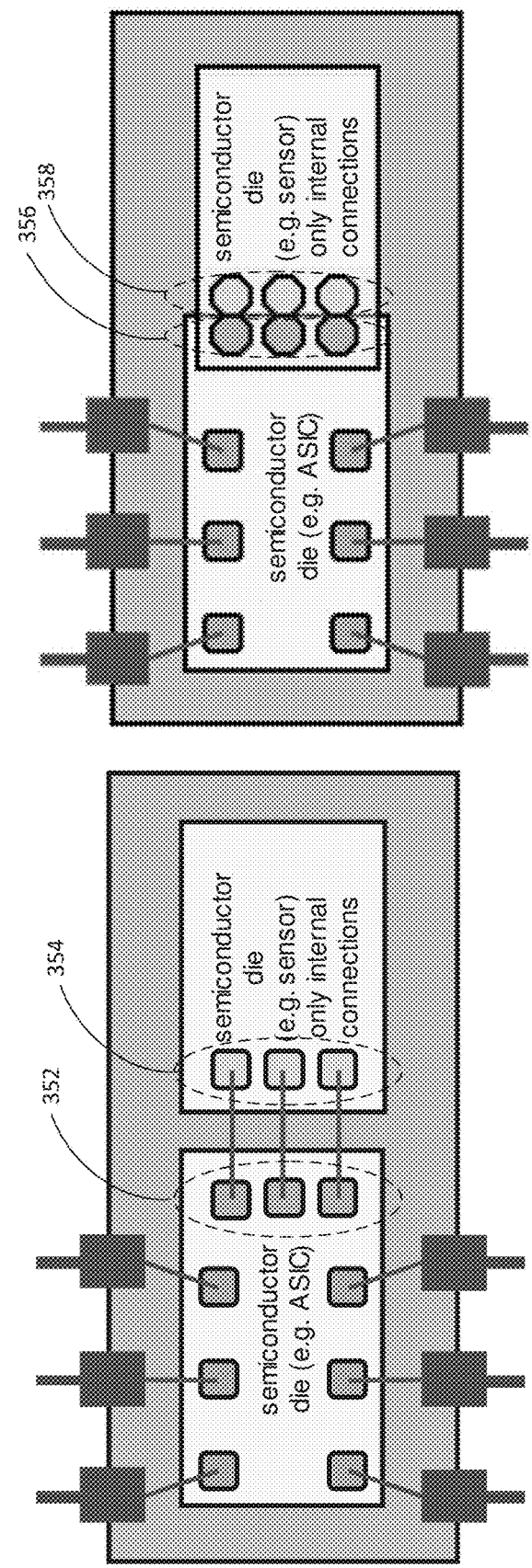

Turning now to FIG. 3C, other multi-die IC packages may include a primary die (an ASIC in this example) having pads that are coupled to the external IC pins, and a secondary die that is only coupled to the primary die via internal connections. These internal connections couple the pads 352 of the first semiconductor die and the pads 354 of the second semiconductor die. Thus, the primary die pads that are coupled to the external pins of the IC package are typically protected via active ESD protection circuitry. The pads 354 of the secondary semiconductor die may lack ESD protection. However, the pads 352 of the primary semiconductor die typically provide some type of ESD protection in this scenario, which may be reduced ESD protection (e.g. only integrated capacitors or other passive ESD protection circuitry, smaller active ESD circuitry components, etc.) as no direct ESD discharge across the secondary semiconductor die may occur.

Finally, and with respect to FIG. 3D, some multi-die ICs may implement vertical die stacking using TSV (Through-Silicon-Vias). Thus, the multi-die IC configuration as shown in FIG. 3D is similar to that shown in FIG. 3C with the exception of the use of vertical die stacking to provide the internal connections between the respective pads 356, 358 of the primary and secondary dies. In this scenario, some of the primary semiconductor die pads are connected to the external IC pins and provide full (e.g. active) ESD protection circuitry. The primary semiconductor die pads 356 are coupled to the secondary semiconductor die pads 358 via vertical die stacking. Similar to the multi-die IC configuration as shown in FIG. 3C, the pads 358 may remain unprotected as long as some ESD protection is provided by primary semiconductor die pads 356, which again may include reduced (e.g. passive) ESD protection.

The pads as discussed with respect to FIGS. 3A-3D may include other components that may be coupled to and/or integrated as part of the pad structure. For example, for conventional multi-die IC package designs, each pad that is coupled to the external IC pins requires a high level of ESD protection, which is typically achieved via the use of active ESD protection circuitry. The active ESD protection circuitry may be coupled to and/or formed as part of each of the pads as discussed above. Again, the active ESD protection circuitry functions to protect the integrated silicon capacitors from ESD events, typically by performing a voltage clamping operation as further discussed herein. But, and as noted above, the ESD protection requirements are only relaxed for pads having internal or die-to-die connections. Thus, conventional solutions require each pad that is directly coupled to an external IC pin to be protected by active ESD protection circuitry components, which is larger and more expensive compared to passive ESD circuitry components such as the integrated silicon capacitors described above.

Thus, and as further discussed below, the embodiments of the present disclosure provide ESD protection for the pads of a primary semiconductor die, some of which may be directly and/or indirectly coupled to external IC pins, via ESD protection circuitry that is integrated as part of the secondary semiconductor die. This saves cost as well as the space that would otherwise be required to provide ESD protection for each externally-coupled semiconductor die pad. Moreover, some multi-die ICs may be manufactured in different stages and/or via different facilities. Thus, the embodiments as described herein allow for a lower cost and simplified semiconductor manufacturing process to be implemented for the primary semiconductor die, which may only utilize passive ESD protection components such as the integrated silicon capacitors noted herein, and shift the more robust ESD protection circuitry components (e.g. the active ESD circuitry) to the secondary semiconductor die.

Multi-Die ESD Protection

Figure 4A:
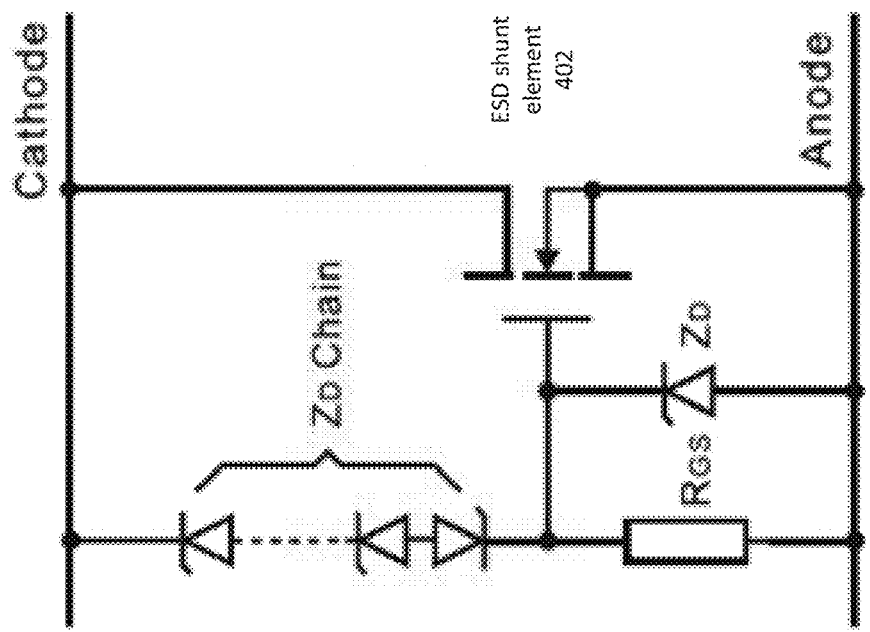
FIG. 4A illustrates an example active ESD protection circuitry, in accordance with an embodiment of the present disclosure.

FIG. 4A illustrates an example active ESD protection circuitry, in accordance with an embodiment of the present disclosure. The active ESD protection circuitry 400 as shown in FIG. 4A is by way of example and not limitation, and the embodiments described herein may implement alternative active ESD protection circuitry, as further discussed below. The active ESD protection circuitry 400 as shown in FIG. 4A implements any suitable number of Zener diodes that form a diode chain, which are coupled between a cathode and a gate terminal of an ESD shunt element 402, which is typically implemented as a large metal oxide semiconductor (MOS) or laterally-diffused MOS (LDMOS)

transistor. The gate terminal of the ESD shunt element 402 is also coupled to the anode via the resistor RGS as another Zener diode Zd.

In this way, a gate bias is provided to the ESD shunt element 402, and the active ESD protection circuitry 400 is triggered by the chain of Zener diodes. Once the trigger voltage formed between the cathode and anode is exceeded, the ESD shunt element 402 then conducts and shunts the ESD current to limit, or clamp, the ESD voltage to less than a clamping voltage, which is a predetermined voltage value. This predetermined voltage value may be selected such that it is less than a maximum voltage rating associated with a respectively coupled silicon integrated capacitor, the details of which are further discussed below. Tuning of the trigger and clamping voltages may be achieved by adjusting the number of Zener diodes in the ZD chain. The active ESD protection circuitry 400 may be coupled in parallel with a component for which ESD protection is to be provided (e.g. a passive integrated component such as a silicon integrated capacitor). Thus, the active ESD protection circuitry 400 is one example of an ESD clamp element, which may also be referred to herein as ESD clamp circuitry or an active ESD protection element, and functions to limit the voltage induced across an ESD-protected component during an ESD event. The ESD clamp circuitry as shown in FIG. 4A may alternatively be referred to as an active clamp, and may be implemented to perform ESD clamping for ICs.

Figure 5:
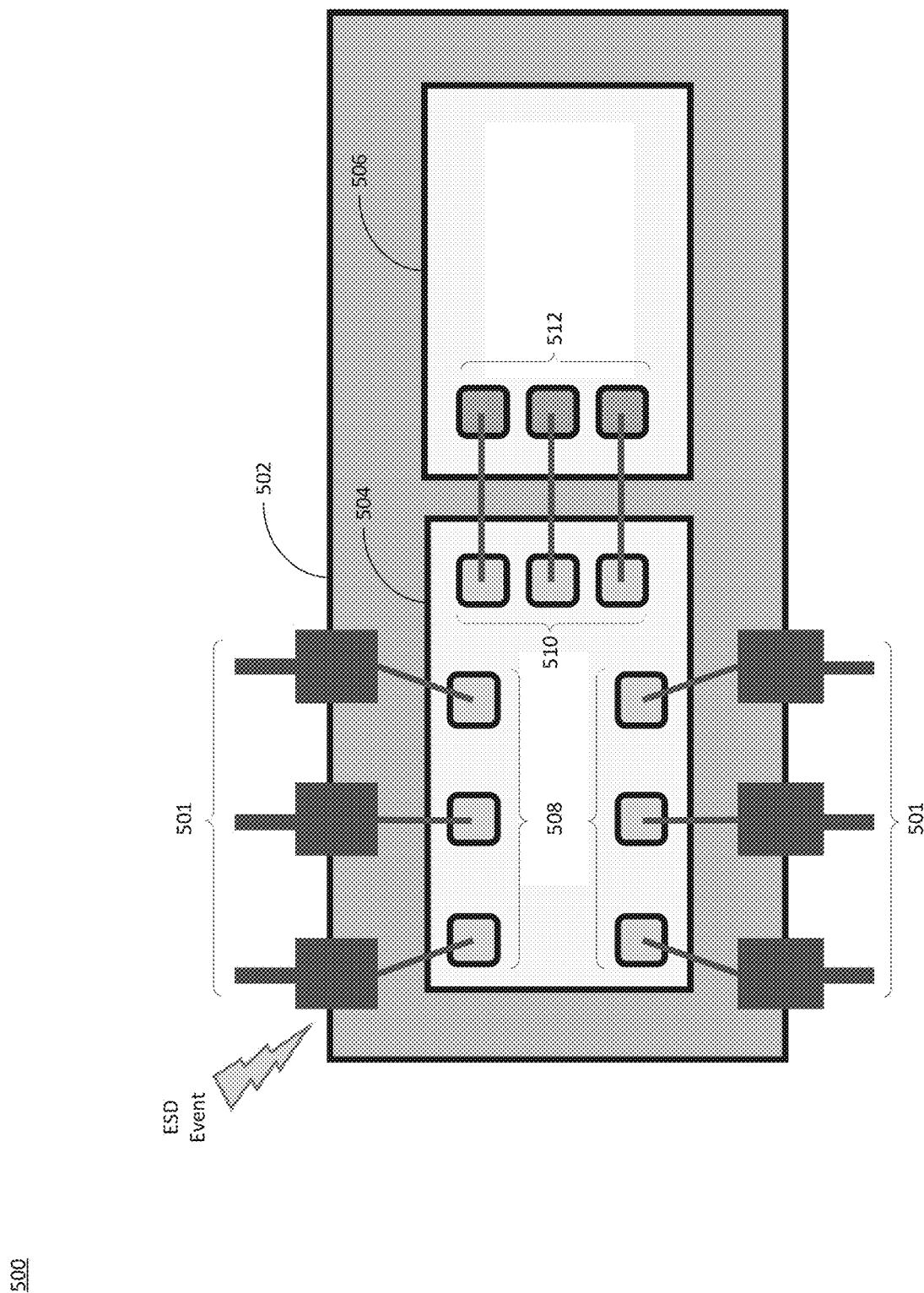
FIG. 5 illustrates a multi-die semiconductor integrated circuit (IC) package that implements ESD protection in a secondary semiconductor die having internal connections, in accordance with an embodiment of the present disclosure.

FIG. 5 illustrates a multi-die semiconductor integrated circuit (IC) package that implements ESD protection in a secondary semiconductor die having internal connections, in accordance with an embodiment of the present disclosure. The multi-die semiconductor IC package 500 as shown in FIG. 5 includes a multi-die semiconductor IC that comprises a first or primary semiconductor die (or simply "die") 504 and a second or secondary die 506, which are integrated or otherwise encapsulated as part of an IC housing 502. The multi-die semiconductor IC package 500 may be implemented to perform any suitable number and/or type of function(s) in accordance with one or more particular applications. Thus, although the multi-die semiconductor IC package 500 is shown in FIG. 5 as including two dies 504, 506, this is by way of example and not limitation, and the multi-die semiconductor IC package 500 may implement any suitable number of semiconductor dies. In any event, the IC housing 502 may be implemented in accordance with any suitable IC package having external pins 501 to form the multi-die semiconductor IC package 500. For example, the multi-die semiconductor IC package 500 may be implemented as a surface mount package (SMP) or as a through-hole mounting package.

The multi-die semiconductor IC package 500 may thus have any suitable size and/or shape, and may include any suitable number of semiconductor dies and external IC pins. Moreover, regardless of the number of semiconductor dies that are implemented as part of the multi-die semiconductor IC package 500, the semiconductor dies may have any suitable configuration of electrical components to perform any suitable type of function. For instance, the first semiconductor die 504 may be implemented as an application specific integrated circuit (ASIC), and the second semiconductor die 506 may be implemented as a sensor die. Thus, the first semiconductor die 504 is coupled to the external IC pins 501, which may comprise voltage source connections, reference potential connections, communication connections, sensed input (e.g. voltage and current) connections, etc. Moreover, the second die 506 may be implemented with any suitable number and/or type of components that may also be implemented in the first die 504, or the second die 506 may include additional or alternative components than those implemented by the first die 504. These components may include, for instance, functional circuitry, power management circuitry, a digital core, analog circuitry, sensor cells and/or sensor components, communication circuitry memory, etc.

Each of the first and the second semiconductor die 504, 506 comprises a set of pads, which are illustrated in FIG. 5 as squares. As noted above, each of these pads may represent any suitable number of circuit components, connections to other pins, pads, components, circuitry, etc., based upon the particular type of semiconductor die that is implemented. For example, each of the pads may represent and/or include connections to components described herein such as silicon integrated capacitors and/or resistors, which may represent passive ESD protection circuitry components, as well as active ESD protection circuitry components. However, and as further discussed herein, the embodiments of the present disclosure enable the pads of the second semiconductor die 506 to be coupled to and/or include ESD protection circuitry that functions to provide a higher level of ESD protection compared to the first semiconductor die 504.

For example, and with continued reference to FIG. 5, the first semiconductor die 504 includes a set of pads that comprises a first subset of pads 508 and a second subset of pads 510. Moreover, in the example shown in FIG. 5 the second die 506 includes a set of pads 512. The pads of the first die 504 are thus referred to as groups or pad subsets, e.g. first and second subsets 508, 510, respectively, based upon their respective connections. For instance, the pads 508 are coupled to the external pins 501, whereas the pads 510 are internally coupled to the pads 512 of the second die 506. Although the pads 508, 510, 512 as shown in FIG. 5 are coupled to the external pins 501 or internally, as the case may be, via bond wires, this is by way of example and not limitation. The multi-die semiconductor IC package 500 may be implemented in accordance with any suitable type of semiconductor technology that facilitates the connections between any of the pads of the dies 504, 506 to the external pins and/or to one another internally, which may be formed in accordance with any suitable type of connection(s), and which may include the aforementioned through-silicon-vias or any other suitable bonding technologies.

In any event, the semiconductor die 504 faces the external pins 501, which are exposed to the ESD stress. In an embodiment, the semiconductor die 504 may include integrated passive devices such as silicon integrated capacitors and/or resistors, for example. These components may comprise passive ESD protection circuitry components that are coupled to and/or integrated as part of the pads 508 and/or 510, which function to provide passive or reduced ESD protection with respect to the occurrence of ESD events at the external pins 501. However, to provide ESD protection for these integrated passive devices, the present embodiment implements more robust ESD protection via the second semiconductor die 506.

To provide some examples, the ESD protection provided by the second semiconductor die 506 may comprise active or passive ESD protection circuitry, and may be coupled to the pads 512 and/or comprise part of the pads 512. However, the use of active ESD protection circuitry may be particularly useful to protect the integrated passive devices implemented via the first semiconductor die 504 by limiting or clamping the voltage caused by ESD events. In doing so, the integrated passive devices are exposed to a voltage less than their maximum rating, as further discussed below. In this way, the ESD protection circuitry implemented by the second semiconductor die 506 provides ESD protection for the first semiconductor die 504 in response to ESD events occurring via the external pins 501.

Figure 6:
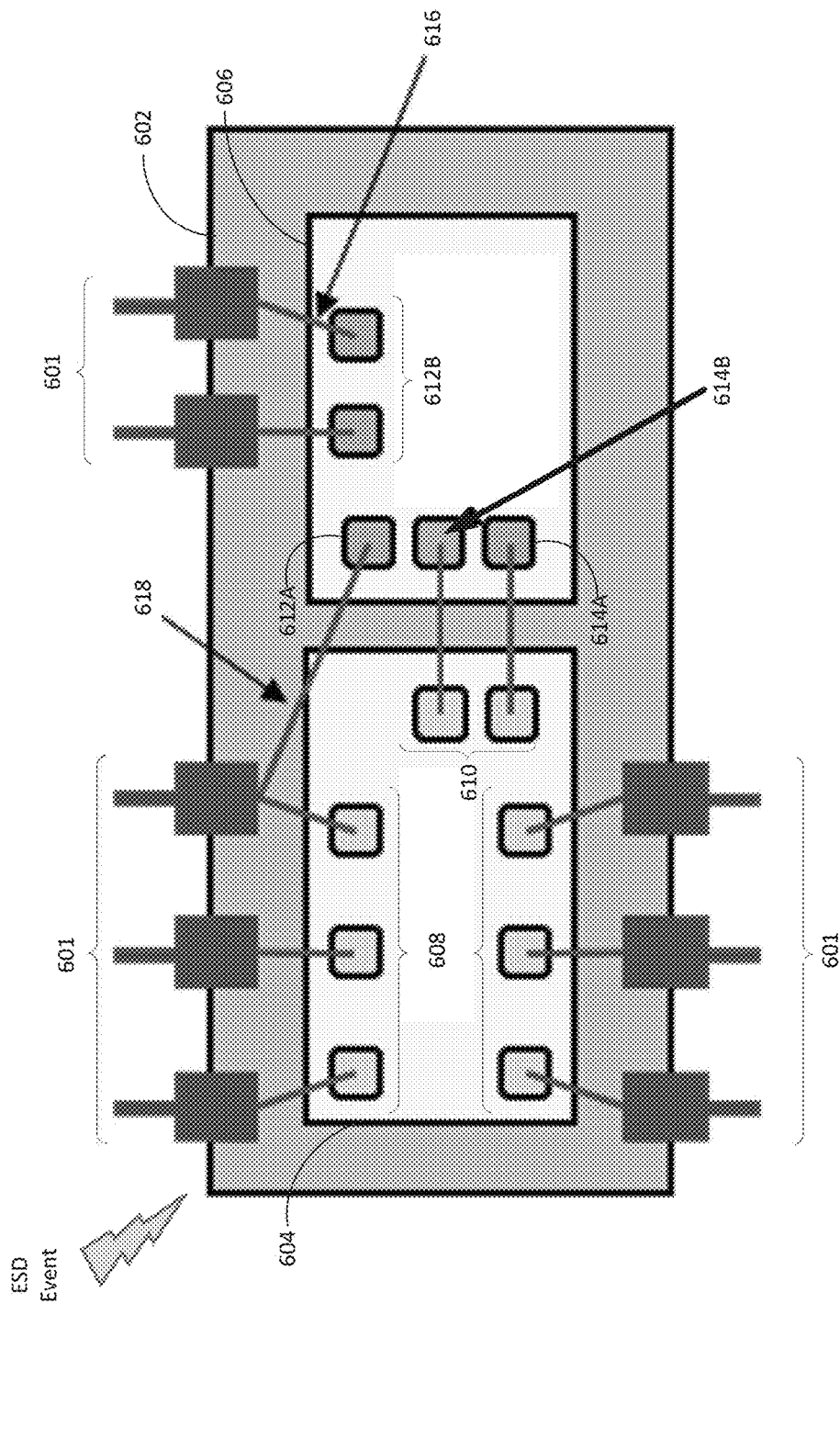
FIG. 6 illustrates a multi-die semiconductor integrated circuit (IC) package that implements ESD protection in a secondary semiconductor die having internal and external connections, in accordance with an embodiment of the present disclosure.

FIG. 6 illustrates a multi-die semiconductor integrated circuit (IC) package that implements ESD protection in a secondary semiconductor die including internal and external connections, in accordance with an embodiment of the present disclosure. The multi-die semiconductor IC package 600 as shown in FIG. 6 comprises similar components as the multi-die semiconductor IC package 500 as shown in FIG. 5. Thus, the same description provided above with respect to the multi-die semiconductor IC package 500 as shown in FIG. 5 also applies to the multi-die semiconductor IC package 600 as shown in FIG. 6, with further differences as noted herein.

For example, the multi-die semiconductor IC package 600 also includes a multi-die semiconductor IC that comprises a first die 604 and a second die 606, which are integrated or otherwise encapsulated as part of an IC housing 602. As noted above for the multi-die semiconductor IC package 500, the first semiconductor die 604 may also be implemented as an application specific integrated circuit (ASIC), and the second semiconductor die 606 may be implemented as a sensor die. The first and the second die 604, 606 may also be implemented with any suitable number and/or type of components such as functional circuitry, power management circuitry, a digital core, analog circuitry, sensor cells and/or sensor components, communication circuitry memory, etc.

Each of the first and the second semiconductor die 604, 606 also comprises a set of pads, which are illustrated in FIG. 6 as squares and may be coupled to and/or include ESD protection circuitry, as further discussed herein. The first semiconductor 604 includes a set of pads that comprises a first subset of pads 608, which are coupled to the external pins 601, and a second subset of pads 610 that are internally coupled to the pads 614A, 614B of the second die 606. However, in contrast to the multi-die semiconductor IC package 500, the second die 606 also includes a set of pads that are coupled to the external pins 601. As shown in FIG. 6, the second die 606 includes a first subset of pads 612, which may optionally include one or more pads 612A that are coupled to one or more of the pads 608 and to one or more of the external pins 601, as well as one or more pads 612B that are only coupled to the external pins 601. The second die 606 also includes a second subset of pads 614A, 614B, which again are coupled internally to the pads 610.

Again, although the pads 608, 610, 612A, 612B, 614A, 614B, as shown in FIG. 6 are coupled to the external pins 601 and/or internally, as the case may be, via bond wires, this is by way of example and not limitation. The multi-die semiconductor IC package 600 may be implemented in accordance with any suitable type of semiconductor technology that facilitates the connections between any of the pads of the dies 604, 606 to the external pins and/or to one another. These connections may be formed in accordance with any suitable type of couplings, which may include the aforementioned through-silicon-vias or any other suitable bonding technologies.

The ESD protection provided by the second semiconductor die 606 may comprise passive or active ESD protection circuitry, and may be coupled to and/or comprise part of the pads 612A, 612B, 614A, 614B. Again, the use of active ESD protection circuitry may be particularly useful to protect the integrated passive devices implemented via the first semiconductor die 604 by limiting or clamping the voltage caused by ESD events such that the integrated passive devices are exposed to a voltage less than their maximum rating, as further discussed below. Moreover, and as further discussed below, due to cross-currents between the dies 604, 606, a higher level of ESD protection may be provided for the pads 614A, 614B compared to the pads 608, 610, which may instead implement only integrated passive devices to achieve ESD protection (e.g. via damping). However, the pads 614A, 614B may be configured to provide different levels of ESD protection to components that are coupled to these pads, as further discussed below. In this way, the ESD protection circuitry implemented by the second semiconductor die 606 provides ESD protection for the first semiconductor die 604 in response to ESD events occurring via the external pins 601.

Figure 7:
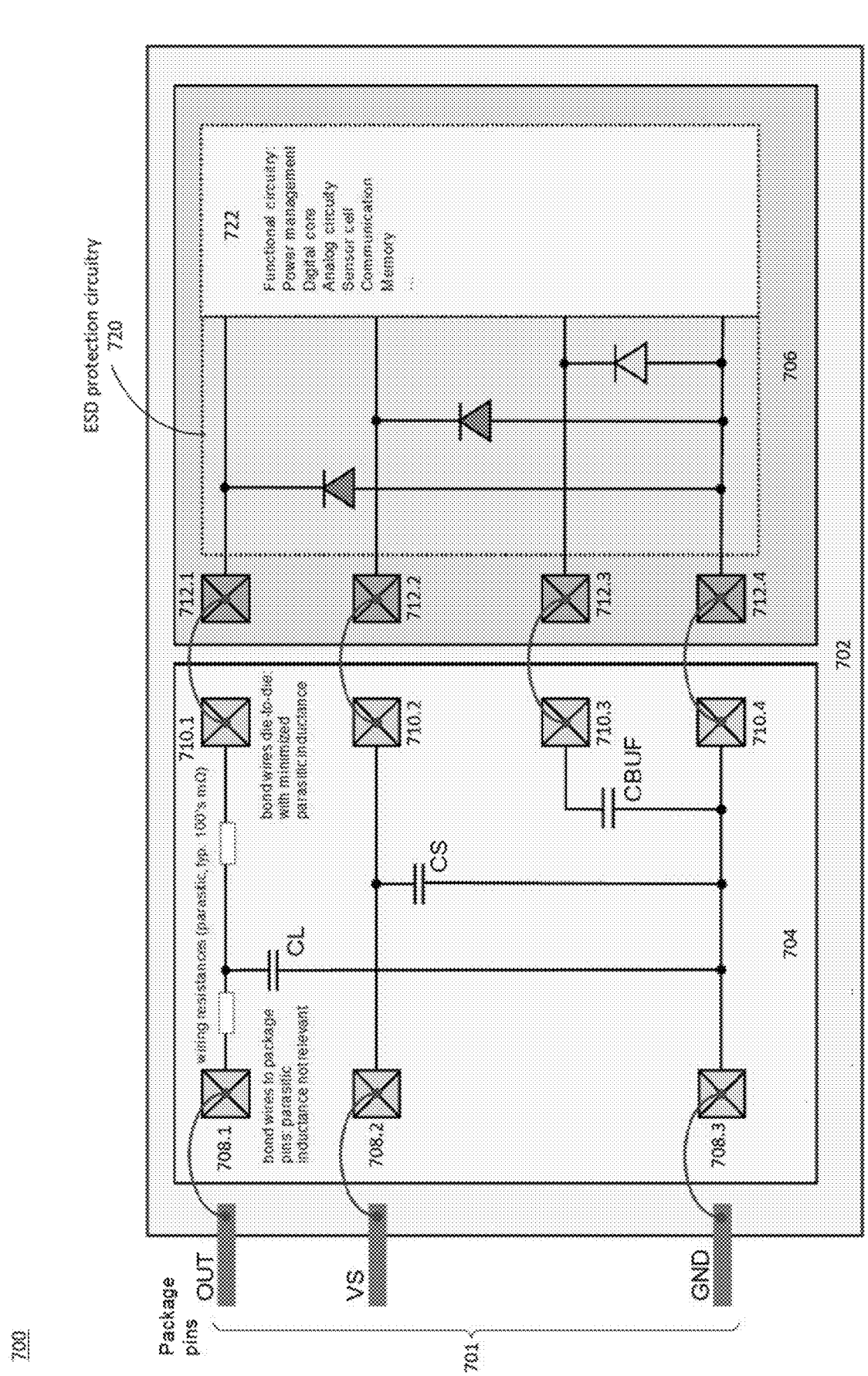
FIG. 7 illustrates a multi-die semiconductor integrated circuit (IC) package that implements ESD protection in a secondary semiconductor die in further detail, in accordance with an embodiment of the present disclosure.

FIG. 7 illustrates a multi-die semiconductor integrated circuit (IC) package that implements ESD protection in a secondary semiconductor die in further detail, in accordance with an embodiment of the present disclosure. The multi-die semiconductor IC package 700 is illustrated in FIG. 7 with only internal connections between the pads of the first and second dies 704, 706, similar to the multi-die semiconductor IC package 500 as shown in FIG. 5. However, the multi-die semiconductor IC package 700 as shown in FIG. 7 may be identified with either of the multi-die semiconductor IC packages 500, 600, as shown in FIGS. 5 and 6, respectively. For example, the first semiconductor die 704 may be identified with either of the first dies 504, 604, and the second die 706 may be identified with either of the dies 506, 606. Furthermore, the bond wires as shown in FIG. 7 are by way of example and, as discussed above with respect to the multi-die semiconductor IC packages 500, 600, the pads of the multi-die semiconductor IC package 700 may be coupled to the external pins 701, to internal connections within the semiconductor dies 704, 706, to other pads, etc., via any suitable coupling techniques.

Moreover, the first die 704 includes a first subset of pads 708, 710, with the number of pads being provided by way of example and not limitation. The second die 706 includes a set of pads 712, with the number of pads also being provided by way of example and not limitation. Again, the second die 706 may include additional pads (e.g. a second subset of pads) that are coupled to the external pins 701 (e.g. directly via bond wires or other suitable coupling mechanisms) and, optionally, to one or more of the pads 708 as discussed above with reference to FIG. 6, although this is not shown in FIG. 7 for purposes of brevity and ease of explanation. The pads 708.1-708.3 may thus be identified with the pads 508, 608 of the multi-die semiconductor IC package 500, 600, respectively. The pads 710.1-710.4 may be identified with the pads 510, 610 of the multi-die semiconductor IC package 500, 600, respectively. The pads 712.1-712.4 may be identified with the pads 512 of the multi-die semiconductor IC package 500. Alternatively, the pads 712.1-712.4 may be identified with the pads 614A, 614B of the multi-die semiconductor IC package 600 (again the pads 612A, 612B as shown in FIG. 6 are not shown in FIG. 7).

In the example shown in FIG. 7, each one of the pads 708.1-708.3 is respectively coupled to a capacitor disposed directly behind each respective pad, which is in turn coupled to a reference potential. The reference potential is ground in this example, but may represent any suitable reference potential depending upon the particular application such as a negative voltage rail for instance. Furthermore, although each capacitor is shown in FIG. 7 as being coupled to the same reference potential, this is also by way of example and not limitation, as each capacitor may alternatively be coupled to a different reference potential, or one or more of the capacitors may share (i.e. be coupled to the same) reference potential, in various embodiments. As shown in FIG. 7, the capacitors CL, CS, and CBUF are coupled to each of the pads 708.1, 708.2, and 708.3, respectively, which are in turn coupled to the external pins 701. In an embodiment, the capacitors CL, CS, and CBUF may be implemented as integrated passive devices, such as the silicon integrated capacitors, for example, as discussed above. Thus, the capacitors CL, CS, and CBUF may function to provide limited or passive ESD protection for the first semiconductor die 704 via capacitive damping of an ESD pulse in response to an ESD event occurring at the pins 701. The term "passive" ESD protection is thus used herein to refer to the use of any suitable passive components to perform ESD pulse damping, versus the implementation of actively switched and/or non-linear components that perform voltage clamping. For example, passive ESD protection may be implemented via passive components such as resistors, capacitors, and/or inductors, which function to perform ESD pulse damping by preventing abrupt current or voltage deviations (in the case of capacitors and inductors, respectively), and/or providing some degree of attenuation (in the case of resistors).

Although such passive ESD protection capabilities may be adequate in the case of large capacitors (e.g. on the order of ~100 nF or more), for many applications (e.g. communication pins) relatively small capacitance values (e.g. on the order of ~1 nF) are required. This mandates a design trade-off between the data rate and ESD/EMC robustness requirements. Therefore, the embodiments as discussed herein provide additional ESD protection to the first die 704 via additional ESD protection circuitry implemented via the second die 706. This protection is implemented by configuring the ESD protection circuitry of the second die 706 in parallel with each respective passive integrated device of the first die 704 for which ESD protection is to be provided. To do so, each of the pads 710.1-710.4 is respectively coupled to one of the pads 712.1-712.4, which is in turn coupled to ESD protection circuitry 720. Thus, each one of the pads 712.1-712.4 is also respectively coupled to one of the capacitors CL, CS, CBUF via the connection between the pads 710.1-710.4 and the pads 712.1-712.4. In this example, the ESD protection circuitry 720 comprises active ESD protection circuitry implemented as an ESD clamp network, which is also referred to herein as clamp circuitry. In the example shown in FIG. 7, the ESD protection circuitry 720 is illustrated as a set of active ESD protection elements, which are diodes in this example, with each being coupled in parallel with each of the capacitors CL, CS, and CBUF of the first die 704. Thus, and as shown in FIG. 7, each ESD protection element of the ESD protection circuitry 720 is coupled between each respective one of the pads 712.1-712.4 and a reference potential, which again is ground this example.

It is noted that the ESD protection circuitry 720 as shown in FIG. 7 is provided by way of example and not limitation. For example, and as noted above for the capacitors CL, CS, and CBUF, the reference potential may differ from ground, and one or more of the active ESD protection elements may be coupled to the same reference potential or to a different reference potential. For example, each of the active ESD protection elements may be coupled in parallel with a respective capacitor CL, CS, CBUF, etc. such that each active ESD protection element and the capacitor that is coupled in parallel with that particular active ESD protection element have the same reference potential.

Furthermore, the ESD protection circuitry 720 as shown in FIG. 7 may include, in addition to or instead of the diodes as shown, additional and/or alternative ESD protection elements (also referred to herein as ESD protection components). In various embodiments, the ESD protection elements of the ESD protection circuitry 720 may be identified with any suitable type of active or passive ESD protection components and/or circuitry. For example, the ESD protection elements of the ESD protection circuitry 720 may be implemented via one or more devices having static characteristics such as diodes, Zener diodes, bipolar transistors, MOS transistors, thyristors, silicon controlled rectifier (SCRs), etc. As yet another example, the ESD protection elements of the ESD protection circuitry 720 may be implemented in accordance with the active ESD protection circuitry 400 as shown in FIG. 4A. Additionally or alternatively, the ESD protection elements of the ESD protection circuitry 720 may be implemented as timer-based ESD protection circuitry as shown in FIG. 4B, which uses the fast rising edge of an ESD event to trigger the voltage clamping process, and turns off again after the timer has timed out.

For example, the ESD protection elements of the active ESD protection circuitry 400 as shown in FIG. 4A that are coupled between the cathode and anode may replace one or more of the diodes of the ESD protection circuitry 720 as shown in FIG. 7, with the cathode being identified with a respective pad 712.1-712.3, and the anode being identified with a reference potential pad 712.4.

Figure 4B:
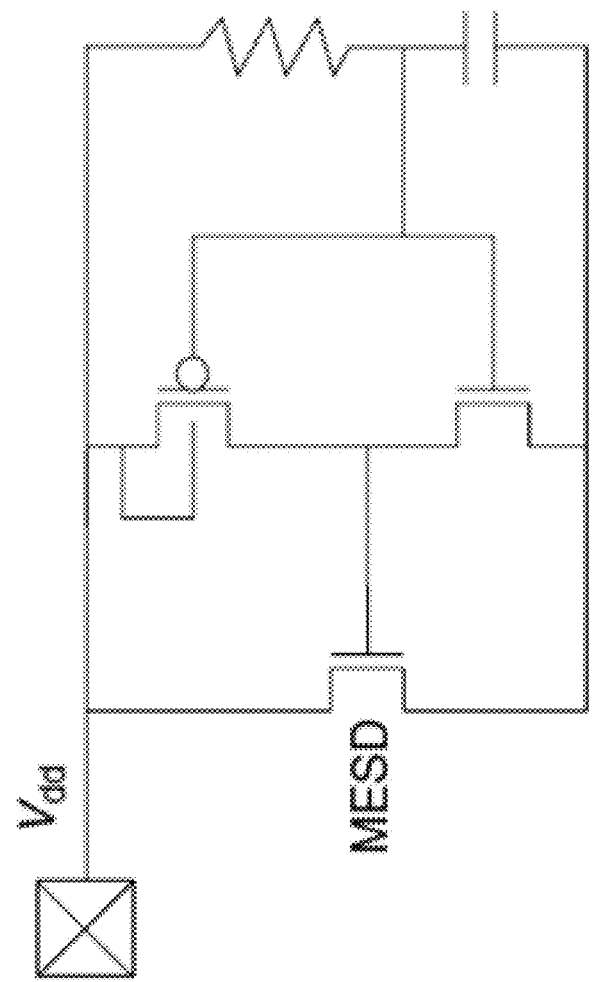
FIG. 4B illustrates another example active ESD protection circuitry, in accordance with an embodiment of the present disclosure.

As yet another example, the ESD protection elements of the active ESD protection circuitry 450 as shown in FIG. 4B represent a known configuration of timer-based ESD protection circuitry, which includes an RC timer that drives the gate of the nMOS clamping device MESD through an inverter. The ESD protection elements of the active ESD protection circuitry 450 as shown in FIG. 4B that are coupled across the clamping device MESD may replace one or more of the diodes of the ESD protection circuitry 720 as shown in FIG. 7, with the anode (i.e. the terminal of the MESD clamping device opposite the Vdd terminal) being identified with a reference potential pad 712.4 and the cathode (i.e. the Vdd terminal) being identified with a respective pad 712.1-712.3. Again, the embodiments as described herein are not limited to these example implementations, and the embodiments herein may be implemented in accordance with any suitable type of active ESD protection circuitry, including those described herein and/or known designs.

In any event, the ESD protection circuitry 720 is configured to provide ESD protection for the first die 704 and the second die 706 (e.g. any components of the second die 706 that may be coupled in parallel with each ESD protection element). The ESD protection circuitry 720 functions to perform voltage clamping (when implemented as active ESD protection elements) in response to ESD events that occur via the pins 701. As a result of this voltage clamping operation, the ESD-induced voltage at each of the pads 708.1-708.3, as well the voltage across other components and the pads coupled directly thereto, is reduced to less than a respective predetermined threshold voltage. This predetermined threshold voltage may be selected based upon the operating characteristics of the integrated capacitors CL, CS, and CBUF. For example, the predetermined threshold voltage may be equal to the maximum voltage rating associated with each of the integrated capacitors CL, CS, and CBUF, or selected in accordance with a suitable safety threshold such as 5%, 10%, etc. in excess of the maximum voltage rating. As an illustrative example, the threshold voltage of the integrated capacitor CL, CS, CBUF, etc. may initially be determined, and then a maximum voltage rating selected that is defined below this threshold voltage to provide a safety band 5%, 10%, etc. below the threshold voltage. It is noted, however, that a certain amount of parasitic resistance may be present in each wiring path (indicated exemplarily for the line of the OUT pin). This parasitic resistance should be considered during the design process, as it may add an additional voltage drop to the clamping voltage.

For ease of explanation, the pads of the first die 704 and the second die 706 may be referred to as different pad groups based upon their respective connections as well as the level of ESD protection provided. For instance, and with reference to FIGS. 6 and 7, the pads 708.1-708.3 may form part of a first set of pads, the pads 710.1-710.4 may form a second set of pads, and the pads 712.1-712.4 may form a third set of pads. Although not shown in FIG. 7 for purposes of brevity, the second die 706 may comprise a fourth set of pads identified with the pads 612A, 612B as shown in FIG. 6, which are coupled to the external pins 701 and optionally to one or more of the pads 708.1-708.3.

In various embodiments, the level of ESD protection provided to each of the pads of the first and second dies 704, 706 (i.e. the ESD protection provided to components coupled to those pads) may vary depending upon the particular application and configuration. As an illustrative example, each one of the pads 710.1, 710.2, and 710.4, which comprise a first subset of the pads 710.1-710.4, is directly coupled to a respective external pin 701 of the IC package. However, the pad 710.3, which comprises a second subset of the pads 710.1-710.4, represents an internal connection between the pads 710.3 and 710.4, which is coupled to the reference potential (ground in this example). The pad 710.3 is thus only indirectly coupled to the external pin 701 of the IC package via the capacitor CBUF. Again, the capacitor CBUF may be implemented as a silicon integrated capacitor, which is coupled to the reference potential at pad 710.4. Thus, because the capacitor CBUF is not directly exposed to ESD events via an IC pin 701, a reduced level of ESD protection is feasible for the pad 710.3 and the capacitor CBUF.

Thus, the ESD protection circuitry 720 may provide a different level of ESD protection for the pad 712.3 (which is coupled to the pad 710.3) compared to the other pads 712.1, 712.2, and 712.4. This reduced level of ESD protection may be realized, for instance, by implementing additional passive ESD protection components (e.g. silicon integrated capacitor(s)) instead of active ESD protection elements such as the diodes as shown in FIG. 7. Alternatively, the reduced level of ESD protection may be implemented as a smaller active ESD protection element compared to those coupled to the pads 712.1 and 712.2. That is, the ESD protection element coupled between the pads 712.3 and 712.4 (e.g. a diode) may be smaller and thus provide a reduced voltage clamping ability, a reduced current shunting ability, etc., compared to the other ESD protection elements. As another example, depending upon functional conditions (e.g. a lower operating voltage at pad 712.3), an active ESD protection element coupled to pad 712.3 may function at a different threshold voltage compared to the active ESD protection element(s) coupled to the other pads 712.1, 712.2, and 712.4. The use of a lower threshold voltage increases the safety margin, reduces power dissipation during the ESD event, and allows for the ESD protection circuitry 720 to be manufactured having a smaller size and a reduced cost.

To provide another example, the ESD protection element coupled between the pads 712.3 and 712.4 may differ from the ESD protection element coupled between the other pads 712.1, 712.2, and 712.4. As an illustrative example, the ESD protection element coupled between the pads 712.3 and 712.4 may be implemented as a single diode, whereas the ESD protection element coupled between the other pads 712.1, 712.2, and 712.4 may be implemented as the active ESD protection circuitry 400, 450 as shown in FIG. 4A or FIG. 4B, respectively. In this way, the ESD protection circuitry 720 may implement different levels of ESD protection via different types of passive and/or ESD protection elements for different pads of the second die 706. Thus, the ESD protection circuitry 720 may provide different levels of ESD protection for the first and second dies 704, 706 based upon the anticipated exposure of specific pads to ESD events. This may advantageously reduce manufacturing costs by recognizing that certain pads of the first and second dies 704, 706 require less robust ESD protection than others.

Figure 8:
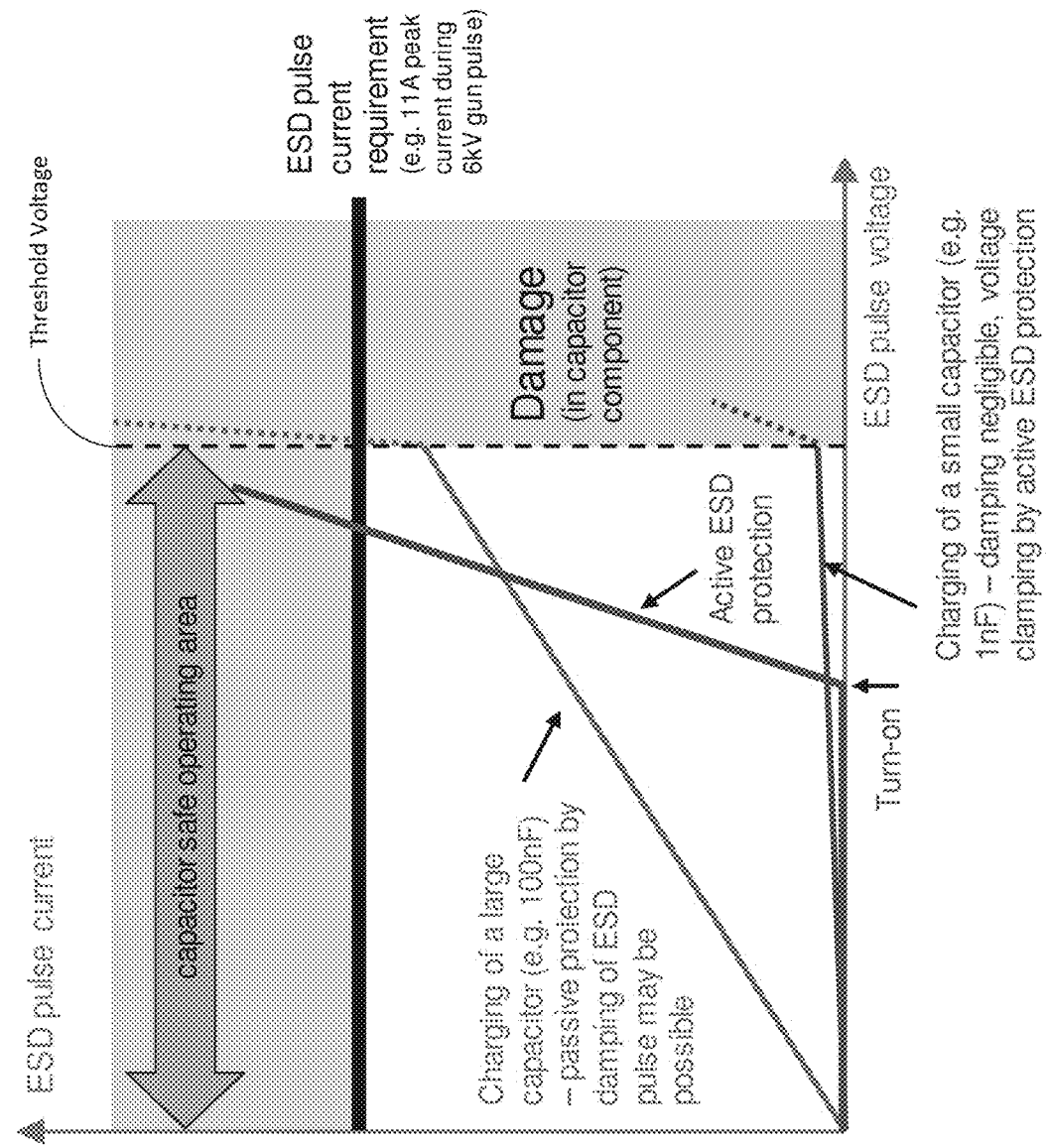
FIG. 8 illustrates an example current voltage (IV) characteristic demonstrating the protection of integrated passive components from ESD events, in accordance with an embodiment of the present disclosure.

FIG. 8 illustrates an example current voltage (IV) characteristic demonstrating the protection of integrated passive components from ESD events, in accordance with an embodiment of the present disclosure. The graph 800 as shown in FIG. 8 illustrates a current threshold that may be defined, for example, in accordance with an applicable standards authority or otherwise defined based upon the particular application. For instance, the ESD pulse current requirement is shown in FIG. 8 and represents an 11A peak current caused by an ESD "gun" that is applied to the external pins of the multi-die semiconductor dies 500, 600, 700 as discussed herein.

The graph 800 as shown in FIG. 8 further illustrates a capacitor safe operating area that may be identified with the silicon integrated capacitors as discussed herein, which again may be integrated as part of and/or be coupled to the pads of the first, second, and/or further semiconductor dies of a multi-die IC which are to be protected in accordance with the embodiments as discussed herein. For example, the capacitor safe operating area as shown in FIG. 8 may be identified with the silicon integrated capacitors integrated as part of and/or coupled to the pads 508, 510, 608, 610, 612A, 612B, 614A, 614B, etc. of the first and/or second semiconductor dies 504, 604, 506, 606 as discussed above with respect to FIGS. 5 and 6, respectively. As another example, the capacitor safe operating area as shown in FIG. 8 may be identified with the silicon integrated capacitors CL, CS, CBUF, etc. as discussed above with respect to FIG. 7.

In any event, the capacitor safe operating area as shown in FIG. 8 defines a threshold voltage above which a silicon integrated capacitor is damaged, and below which the silicon integrated capacitors may safely operate. In an embodiment, the threshold voltage as shown in FIG. 8 may represent a destructive limit of a silicon integrated capacitor. The threshold voltage may be the same for each silicon integrated capacitor that is respectively coupled to an active ESD protection element, or each silicon integrated capacitor may be identified with a different threshold voltage. To provide an illustrative example with respect to FIG. 7, each of the capacitors CL, CS, and CBUF may operate within a voltage range having a maximum threshold voltage as shown in FIG. 8 or, alternatively, each of the capacitors CL, CS, and CBUF may operate up to a destructive limit identified with a different threshold voltage.

In any event, the graph 800 illustrates an ESD design window that depicts the quasi-static current-voltage (IV) characteristics induced during ESD events, which may be short ESD pulses (typically ~100 ns). As an example, the graph 800 may depict the IV characteristics resulting from an active ESD protection element of the ESD protection circuitry 720 as shown in FIG. 7, which is coupled to a respective silicon integrated capacitor to provide active ESD protection. Each active ESD protection element functions to shunt the ESD pulse current at voltages lower than the destructive limit of the respectively-coupled (e.g. in parallel) silicon integrated capacitor, thereby providing active ESD protection. Furthermore, each active ESD protection circuitry element may be configured to operate in accordance with operating parameters such as a respective trigger voltage and clamping voltage. These operating parameters may be the same for each active ESD protection element or vary among the different active ESD protection elements depending upon the requirement of each respectively coupled silicon integrated capacitor that is being protected, in various embodiments. In other words, each active ESD protection element is configured to shunt an ESD pulse current caused by an ESD event at voltages lower than the destructive limit of each silicon integrated capacitor to which the active ESD protection element is coupled.

Again, each active ESD protection element of the ESD protection circuitry 720 is configured to provide a clamping voltage lower than the destructive voltage limit of the silicon integrated capacitor being protected. Of course, the clamping voltage may be selected to be less than this destructive limit as shown in FIG. 8, e.g. by including a suitable safety margin and/or compensating for an additional voltage drop due to parasitic wiring resistances as noted above. It is also noted that the silicon integrated capacitor itself may contribute to the transient voltage clamping by capacitive damping of the ESD pulse. However, this effect is only substantial for large capacitors (e.g. ~100 nF) and without active ESD protection, as shown in FIG. 8, may still result in the capacitor exceeding the destructive limit for higher ESD current values. Furthermore, smaller capacitors (e.g. ~1 nF) contribute very little damping values and are thus subject to ESD damage unless protected by a coupled active ESD protection element. As such, smaller silicon integrated capacitors charge up quickly during an ESD pulse, and the respectively-coupled ESD protection element limits the voltage rise upon the trigger voltage being exceeded to protect the capacitor.

Figure 9:
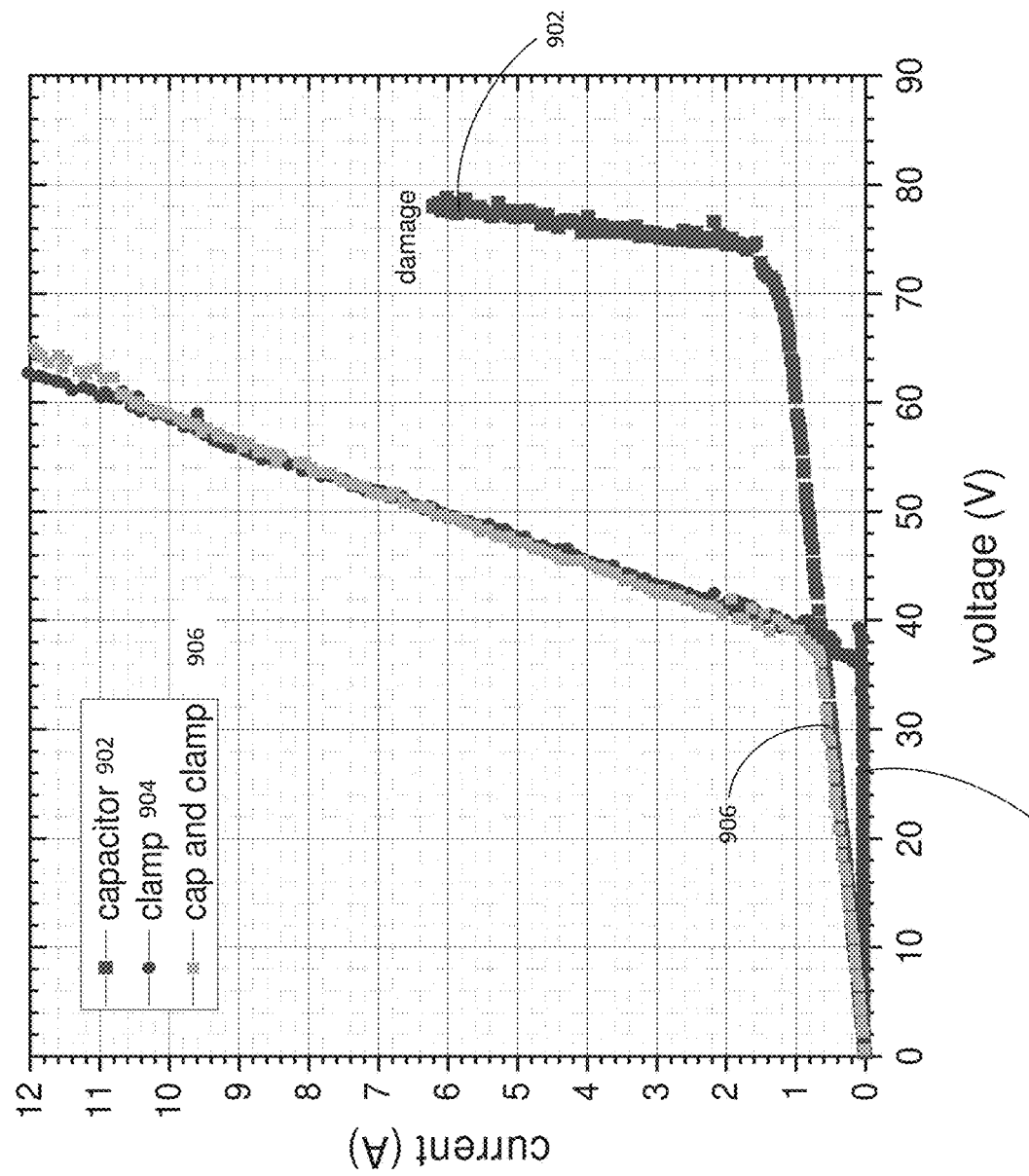
FIG. 9 illustrates an example experimental measurement demonstrating the protection of integrated passive components, in accordance with an embodiment of the present disclosure.

FIG. 9 illustrates an example experimental measurement demonstrating the protection of integrated passive components, in accordance with an embodiment of the present disclosure. The graph 900 as shown in FIG. 9 corresponds to ESD events representing ~100 ns ESD pulses as discussed above with respect to FIG. 8. The experiment as shown with respect to FIG. 9 was performed for a silicon integrated capacitor on a first semiconductor die that is coupled to a pad and to external IC pin, e.g., one of the capacitors CL, CS, CBUF, etc. The capacitor was then coupled to an active ESD protection element, which is disposed on a second, separate die, e.g., one of the active ESD protection elements of the ESD protection circuitry 720.

The graph 900 as shown in FIG. 9 thus represents the measured IV characteristics from the damping effect of the silicon integrated capacitor (trace 902), the voltage clamping provided by the active ESD element (trace 904), and the combination of the damping effect of the silicon integrated capacitor and the voltage clamping provided by the active ESD element (trace 906).

It is noted that the traces 902, 906 correspond to the analogous traces as shown in FIG. 8 showing the IV characteristics for an unprotected small capacitor and for a capacitor protected via an active ESD protection element, respectively. Moreover, and assuming that the silicon integrated capacitor fails at a threshold voltage over 78V, it is observed from trace 902 that the ESD event would otherwise result in damage to the silicon integrated capacitor. However, and as shown by trace 906, when coupled in parallel with an active ESD protection element in accordance with the embodiments as described herein, the voltage induced across the silicon integrated capacitor is clamped while the ESD current is shunted to provide adequate ESD protection by maintaining the voltage across the protected silicon integrated capacitor to less than 78V.

Examples

The techniques of this disclosure may also be described in the following examples.

Example 1. A multi-die semiconductor integrated circuit (IC), comprising: a first semiconductor die including a first set of pads and a second set of pads, the first set of pads being coupled to respective external pins of an IC package; and a second semiconductor die including a third set of pads coupled to respective ones of the second set of pads, wherein the second semiconductor die includes electrostatic discharge (ESD) protection circuitry configured to provide ESD protection for the first semiconductor die in response to ESD events occurring via the external pins of the IC package to which the first set of pads are coupled.

Example 2. The multi-die semiconductor IC of Example 1, wherein the ESD protection circuitry comprises active ESD protection circuitry.

Example 3. The multi-die semiconductor IC of any combination of Examples 1-2, wherein the ESD protection circuitry comprises clamp circuitry configured to provide the ESD protection by performing voltage clamping in response to the ESD events to reduce a respective ESD-induced voltage at each of the first set of pads to less than a respective predetermined threshold voltage.

Example 4. The multi-die semiconductor IC of any combination of Examples 1-3, wherein each one of a subset of the first set of pads is respectively coupled to a silicon integrated capacitor, which is respectively coupled to a reference potential to provide passive ESD protection for the first semiconductor die.

Example 5. The multi-die semiconductor IC of any combination of Examples 1-4, wherein the predetermined threshold voltage represents, for each respective silicon integrated capacitor of the first semiconductor die, a maximum voltage rating associated therewith.

Example 6. The multi-die semiconductor IC of any combination of Examples 1-5, wherein the clamp circuitry is configured to shunt an ESD pulse current caused by the ESD events at voltages lower than a destructive limit of each respective silicon integrated capacitor to which each respective one of the subset of the first set of pads in the first semiconductor die is respectively coupled.

Example 7. The multi-die semiconductor IC of any combination of Examples 1-6, wherein each one of a subset of the first set of pads of the first semiconductor die is respectively coupled to a silicon integrated capacitor, which is coupled to a respective reference potential to provide passive ESD protection for the first semiconductor die.

Example 8. The multi-die semiconductor IC of any combination of Examples 1-7, wherein the second semiconductor die further comprises a fourth set of pads, each pad from among the fourth set of pads being respectively coupled to an external pin of the IC package.

Example 9. The multi-die semiconductor IC of any combination of Examples 1-8, wherein one of the third set of pads of the second semiconductor die is coupled to one of the first set of pads of the first semiconductor die via one of the external pins of the IC package.

Example 10. The multi-die semiconductor IC of any combination of Examples 1-9, wherein the ESD protection circuitry is configured to perform voltage clamping in response to the ESD events to reduce a respective ESD-induced voltage at each one of the first set of pads and each one of the third set of pads to less than a respective predetermined threshold voltage, thereby providing active ESD protection for the first semiconductor die and the second semiconductor die.

Example 11. The multi-die semiconductor IC of any combination of Examples 1-10, wherein each one of a first subset of the second set of pads is directly coupled to a respective external pin of the IC package.

Example 12. The multi-die semiconductor IC of any combination of Examples 1-11, wherein each one of the first subset of the second set of pads is coupled to a respective silicon integrated capacitor that is coupled to a respective reference potential to provide passive ESD protection for the first semiconductor die.

Example 13. The multi-die semiconductor IC of any combination of Examples 1-12, wherein each one of a second subset of the second set of pads is indirectly coupled to a respective external pin of the IC package via a respective silicon integrated capacitor, which is coupled to a respective reference potential to provide passive ESD protection for the first semiconductor die.

Example 14. The multi-die semiconductor IC of any combination of Examples 1-13, wherein the respective reference potential to which each respective silicon integrated capacitor of the first subset of the second set of pads is coupled is a same first reference potential, and wherein the respective reference potential to which each respective silicon integrated capacitor of the second subset of the second set of pads is coupled is a same second reference potential.

Example 15. The multi-die semiconductor IC of any combination of Examples 1-14, wherein the first reference potential and the second reference potential is ground.

Example 16. The multi-die semiconductor IC of any combination of Examples 1-15, wherein each one of a subset of the second set of pads is indirectly coupled to a respective external pin of the IC package via a respective silicon integrated capacitor, which is coupled to a respective reference potential to provide passive ESD protection for the first semiconductor die.

Example 17. The multi-die semiconductor IC of any combination of Examples 1-16, wherein the ESD protection circuitry associated with respective ones of the third set of pads in the second semiconductor die that are coupled to the first subset of the second set of pads provides a higher level of ESD protection compared to the ESD protection circuitry associated with respective ones of the third set of pads in the second semiconductor die that are coupled to the second subset of the second set of pads.

Example 18. The multi-die semiconductor IC of any combination of Examples 1-17, wherein the ESD protection circuitry comprises an active ESD protection circuitry component that is coupled between each respective one of the third set of pads and a reference potential.

Example 19. The multi-die semiconductor IC of any combination of Examples 1-18, wherein the active ESD protection circuitry component comprises a diode.

Example 20. The multi-die semiconductor IC of any combination of Examples 1-19, wherein the active ESD protection circuitry component comprises timer-based ESD protection circuitry.

CONCLUSION

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

It is further to be noted that specific terms used in the description and claims may be interpreted in a very broad sense. For example, the terms "circuit" or "circuitry" used herein are to be interpreted in a sense not only including hardware but also software, firmware or any combinations thereof. The term "data" may be interpreted to include any form of representation data. The term "information" may in addition to any form of digital information also include other forms of representing information. The term "entity" or "unit" may in embodiments include any device, apparatus circuits, hardware, software, firmware, chips, or other semiconductors as well as logical units or physical implementations of protocol layers etc. Furthermore, the terms "coupled" or "connected" may be interpreted in a broad sense not only covering direct but also indirect coupling.

It is further to be noted that methods disclosed in the specification or in the claims may be implemented by a device having means for performing each of the respective steps of these methods.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A multi-die semiconductor integrated circuit (IC), comprising:
    a first semiconductor die including a first set of pads and a second set of pads, the first set of pads being coupled to respective external pins of an IC package; and
    a second semiconductor die including a third set of pads coupled to respective ones of the second set of pads,
    wherein the first semiconductor die includes passive electrostatic discharge (ESD) protection circuitry configured to provide passive ESD protection for the first semiconductor die, the passive ESD circuitry comprising only passive ESD protection components, and
    wherein the second semiconductor die includes active ESD protection circuitry configured to provide active ESD protection for the first semiconductor die in response to ESD events occurring via the external pins of the IC package to which the first set of pads are coupled.

2. The multi-die semiconductor IC of claim 1, wherein the active ESD protection circuitry comprises clamp circuitry configured to provide the active ESD protection by performing voltage clamping in response to the ESD events to reduce a respective ESD-induced voltage at each of the first set of pads to less than a respective predetermined threshold voltage.

3. The multi-die semiconductor IC of claim 2, wherein the passive ESD protection components comprise silicon integrated capacitors, and wherein each one of a subset of the first set of pads is respectively coupled to a respective one of the silicon integrated capacitors, which is respectively coupled to a reference potential to provide the passive ESD protection for the first semiconductor die.

4. The multi-die semiconductor IC of claim 3, wherein the predetermined threshold voltage represents, for each respective one of the silicon integrated capacitors of the first semiconductor die, a maximum voltage rating associated therewith.

5. The multi-die semiconductor IC of claim 3, wherein the clamp circuitry is configured to shunt an ESD pulse current caused by the ESD events at voltages lower than a destructive limit of each respective one of the silicon integrated capacitors to which each respective one of the subset of the first set of pads in the first semiconductor die is respectively coupled.

6. The multi-die semiconductor IC of claim 1, wherein the passive ESD protection components comprise silicon integrated capacitors, and
wherein each one of a subset of the first set of pads of the first semiconductor die is respectively coupled to a respective one of the silicon integrated capacitors, which is coupled to a respective reference potential to provide the passive ESD protection for the first semiconductor die.

7. The multi-die semiconductor IC of claim 1, wherein the second semiconductor die further comprises a fourth set of pads, each pad from among the fourth set of pads being respectively coupled to one of the external pins of the IC package.

8. The multi-die semiconductor IC of claim 1, wherein one of the third set of pads of the second semiconductor die is coupled to one of the first set of pads of the first semiconductor die via one of the external pins of the IC package.

9. The multi-die semiconductor IC of claim 1, wherein the active ESD protection circuitry is configured to perform voltage clamping in response to the ESD events to reduce a respective ESD-induced voltage at each one of the first set of pads and each one of the third set of pads to less than a respective predetermined threshold voltage, thereby providing the active ESD protection for the first semiconductor die and the second semiconductor die.

10. The multi-die semiconductor IC of claim 1, wherein each one of a first subset of the second set of pads is directly coupled to a respective one of the external pins of the IC package.

11. The multi-die semiconductor IC of claim 10, wherein the passive ESD protection components comprise silicon integrated capacitors, and wherein each one of the first subset of the second set of pads is coupled to a respective one of the silicon integrated capacitors that is coupled to a respective reference potential.

12. The multi-die semiconductor IC of claim 11, wherein each one of a second subset of the second set of pads is indirectly coupled to a respective one of the external pins of the IC package via a respective one of the silicon integrated capacitors, which is coupled to a respective reference potential.

13. The multi-die semiconductor IC of claim 12, wherein the respective reference potential to which each respective one of the silicon integrated capacitors of the first subset of the second set of pads is coupled is a same first reference potential, and
wherein the respective reference potential to which each respective one of the silicon integrated capacitors of the second subset of the second set of pads is coupled is a same second reference potential.

14. The multi-die semiconductor IC of claim 13, wherein the first reference potential and the second reference potential is ground.

15. The multi-die semiconductor IC of claim 1, wherein the passive ESD protection components comprise silicon integrated capacitors, and
wherein each one of a subset of the second set of pads is indirectly coupled to a respective one of the external pins of the IC package via a respective one of the silicon integrated capacitors, which is coupled to a respective reference potential.

16. The multi-die semiconductor IC of claim 1, wherein the active ESD protection circuitry comprises active ESD protection circuitry components, with each respective one of the active ESD protection circuitry components being coupled between each respective one of the third set of pads and a reference potential.

17. The multi-die semiconductor IC of claim 16, wherein one or more of the active ESD protection circuitry components comprise diodes.

18. The multi-die semiconductor IC of claim 16, wherein one or more of the active ESD protection circuitry components comprise timer-based ESD protection circuitry.

19. The multi-die semiconductor IC of claim 1, wherein the second semiconductor die is coupled to the first semiconductor die only via the third set of pads being coupled to respective ones of the second set of pads, which comprise internal connections of the IC package.

20. The multi-die semiconductor IC of claim 1, wherein the second semiconductor die is not directly coupled to the external pins of the IC package.

* * * * *